US006254758B1

(12) United States Patent
Koyama

(10) Patent No.: US 6,254,758 B1
(45) Date of Patent: Jul. 3, 2001

(54) METHOD OF FORMING CONDUCTOR PATTERN ON WIRING BOARD

(75) Inventor: Toshinori Koyama, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 09/243,507

(22) Filed: Feb. 1, 1999

(30) Foreign Application Priority Data

Feb. 2, 1998 (JP) .................................................. 10-020890

(51) Int. Cl.[7] ............................. C23C 28/02; C25D 5/02; C25D 5/50

(52) U.S. Cl. ........................... 205/187; 205/126; 205/224

(58) Field of Search ..................................... 205/126, 187, 205/224

(56) References Cited

U.S. PATENT DOCUMENTS

| 4,686,015 | * | 8/1987 | Samuels et al. | 204/15 |
| 5,108,786 | * | 4/1992 | Bayes | 427/98 |
| 6,054,061 | * | 4/2000 | Bayes et al. | 216/13 |

FOREIGN PATENT DOCUMENTS 62-115893 * 5/1987 (JP) .

* cited by examiner

*Primary Examiner*—Edna Wong
(74) *Attorney, Agent, or Firm*—Pennie & Edmonds LLP

(57) ABSTRACT

A method of forming a conductor pattern on a wiring board, in which a conductor pattern forming process on the wiring board can be simplified; and an interval between the conductor patterns can be further reduced by suppressing the etching conducted on the side portions of the electrolytic copper plated layer. The method of forming a conductor pattern on a wiring board in which an electroless copper plated layer 12 is formed on a surface of an insulating layer 10 of the wiring board and an electrolytic copper plated layer 16 is formed on the electroless copper plated layer 12, comprises the steps of: forming an electroless copper plated layer 12 on the insulating layer 10; forming and patterning a layer of resist 14 on the electroless copper plated layer 12; forming an electrolytic copper plated layer 16 on the electroless copper plated layer 12 exposed from the layer of plated resist 14; removing the layer of plated resist 14 for exposing the electroless copper plated layer 12 except for a portion in which the electrolytic copper plated layer 16 is formed; and removing the exposed electroless copper plated layer 12 by using an etching solution composed of a mixed aqueous solution containing sulfuric acid, hydrogen peroxide and Cu chelate agent.

10 Claims, 5 Drawing Sheets

Fig. 2

RESULTS OF PATTERN FORMING

| DESIGNED WIDTH OF PATTERN (μm) L/S= | THICKNESS OF PLATED LAYER AFTER PATTERN PLATING (μm) | WIDTH OF FORMED PATTERN (μm) L/S= | THICKNESS OF PLATED LAYER AFTER BASE ETCHING (μm) |
|---|---|---|---|
| 50/50 | 15~20μm | 48/52~52/48 | 14~19μm |
| 40/40 | | 38/42~42/38 | |
| 30/30 | | 28/32~32/28 | |
| 20/20 | | 17/23~20/20 | |

RESULTS OF MIGRATION BETWEEN LINES

Fig.6
PRIOR ART
STEP (a) 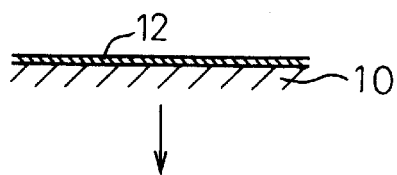
STEP (b) 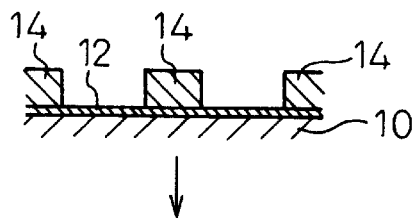
STEP (c) 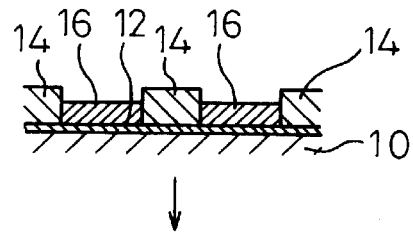
STEP (d) 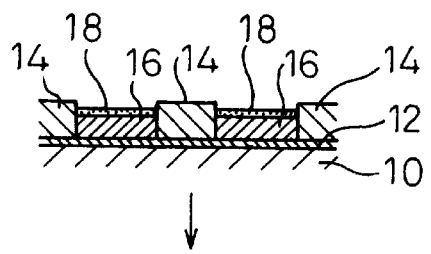
STEP (e) 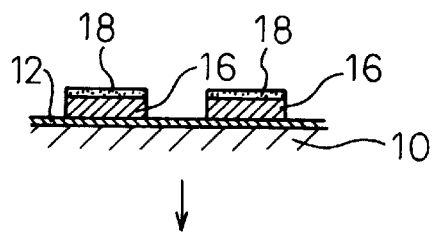
STEP (f) 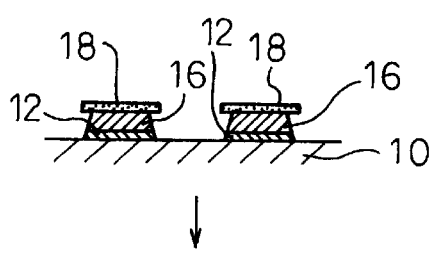
STEP (g) 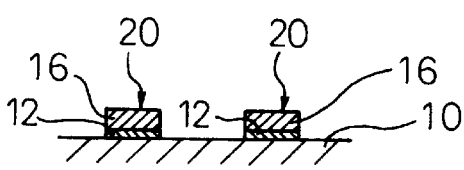

METHOD OF FORMING CONDUCTOR PATTERN ON WIRING BOARD

BACKGROUND OF THE INVENTION

1. Field of the Invention

The present invention relates to a method of forming a conductor pattern on a wiring board such as a multiple layer wiring board.

2. Description of the Related Art

Referring to FIG. 6, a conventional method of forming a conductor pattern on a wiring board known in the prior art will be explained as follows.

First, an electroless copper plated layer 12 is formed on an insulating layer 10 of a wiring board as shown in Step (a) of FIG. 6. In this case, the insulating layer includes an insulating layer which is interposed between conductor patterns formed on a multiple layer for the purpose of ensuring the electrical insulation between the conductor patterns. Further, the insulating layer includes a base material itself. These circumstances are the same in this specification hereinafter.

Next, a layer of plated resist 14 is patterned on the electroless copper plated layer 12 as shown in Step (b) of FIG. 6.

Next, an electrolytic copper plated layer 16 is patterned and plated on the exposed electroless copper plated layer 12 as shown in Step (c) of FIG. 6, wherein the electroless copper plated layer 12 is used as an electrical feed layer.

Next, a layer of etching resist 18 is formed on the electrolytic copper plated layer 16 as shown in Step (d) of FIG. 6. Examples of the layer of etching resist 18 are layers of plated solder and tin.

Next, the layer of plated resist 14 is removed as shown in Step (e) of FIG. 6.

Next, the exposed electroless copper plated layer 12 is removed by using an etching solution as shown in Step (f) of FIG. 6. In this case, an alkali etching solution is used as the etching solution.

Finally, the layer of etching resist 18 is removed from the electrolytic copper plated layer 16. Due to the foregoing, a conductor pattern 20, in which the electrolytic copper plated layer 16 is laminated on the electroless copper plated layer 12, can be formed on the insulating layer 10 of the wiring board.

However, the above conventional method of forming a conductor pattern on a wiring board is disadvantageous as shown by the following. In the above method of forming a conductor pattern on a wiring board, an alkali etching solution is used as the etching solution for removing the electroless copper layer 12. Therefore, not only the layer of electroless copper plating but also the layer of electrolytic copper plating is etched. Therefore, in order to prevent the thickness of the electrolytic copper plated layer 16, which mainly composes the conductor pattern 20, from being reduced, the layer of etching resist 18, which is a protective film for protecting the electrolytic copper plated layer 16 from the etching solution, is formed on the electrolytic copper plated layer 16. In this case, the processes of forming and removing the layer of etching resist 18 are indispensable. Accordingly, the process of forming the conductor pattern becomes complicated.

Even when the layer of etching resist 18 is formed on the electrolytic copper plated layer 16, as long as the alkali etching solution is used as the etching solution, side portions of the electrolytic copper plated layer 16, which are not covered with the layer of etching resist 18, are etched, and the width of the electrolytic copper plated layer 16 is reduced. For the above reasons, it is conventional that the electrolytic copper plated layer 16, the width of which is larger than the width of the target conductor pattern 20, is formed while consideration is given to the above reduction of the width of the electrolytic copper plated layer 16. According to the above conventional method, the width of the electrolytic copper plated layer 16 must be formed to be wider than the width of the target conductor pattern 20. Accordingly, it is impossible to reduce an interval (gap) between the conductor patterns 20 to a limit of resolution of the plated resist 14.

SUMMARY OF THE INVENTION

The present invention has been accomplished to solve the above problems. It is an object of the present invention to provide a method of forming a conductor pattern on a wiring board characterized in that: a conductor pattern forming process on the wiring board can be simplified; and an interval between the conductor patterns can be further reduced by suppressing the etching conducted on the side portions of the electrolytic copper plated layer.

The present invention provides a method of forming a conductor pattern of a wiring board, said method comprising the steps of: forming an electroless copper plated layer on a surface of an insulating layer; forming and patterning a layer of resist on the electroless copper plated layer; forming an electrolytic copper plated layer on the electroless copper plated layer exposed from the layer of patterned resist; removing the layer of resist for exposing the electroless copper plated layer except for a portion in which the electrolytic copper plated layer is formed; and removing the exposed electroless copper plated layer by using an etching solution composed of a mixed aqueous solution containing sulfuric acid, hydrogen peroxide and Cu chelate agent.

According to the above method, it is possible to selectively etch the electroless copper plated layer because the etching rate of electroless copper plating is greatly different from the etching rate of electrolytic copper plating due to a difference in the crystallizing condition between electroless copper plating and electrolytic copper plating in an etching solution composed of a mixed aqueous solution containing sulfuric acid, hydrogen peroxide and Cu chelate agent. For the above reasons, it is unnecessary to provide a layer of etching resist for protecting the electrolytic copper plated layer from the etching solution. Therefore, it is possible to omit the processes of forming and removing the layer of etching resist. Therefore, the entire process of forming the conductor pattern can be simplified. Further, there is no possibility of fluctuation of the width and thickness of the electrolytic copper plated layer. Accordingly, it is possible to set the thickness and width of the electrolytic copper plated layer to the thickness and width of the target conductor pattern even at the beginning of setting. Therefore, it is possible to form a conductor pattern, the gap of which is reduced to the limit of resolution of the resist.

When a step of annealing is provided, in which heat treatment is conducted on the electrolytic copper plated layer before the electroless copper plated layer is removed, a difference in the crystallizing condition between electroless copper plating and electrolytic copper plating is further extended, and a difference in the etching rate is extended. Consequently, it becomes possible to etch the electroless copper plated layer more selectively. Due to the foregoing, a quantity of etched electrolytic copper plated layer can be further reduced. Therefore, it becomes possible to form a finer conductor pattern.

BRIEF DESCRIPTION OF THE DRAWINGS

FIG. 2 is an evaluation view showing rates of reduction, which is conducted by an etching solution, of the film thickness and pattern width of a conductor pattern formed by the method of forming a conductor pattern shown in FIG. 1;

FIG. 6 is a process drawing showing a conventional method of forming a conductor pattern on a wiring board.

DETAILED DESCRIPTION OF THE PREFERRED EMBODIMENT

Referring to the accompanying drawings, a preferred embodiment of the method of forming a conductor pattern on a wiring board according to the present invention will be explained below.

First, referring to FIG. 1, the method of forming a conductor pattern on a wiring board will be explained while comparison is made between the method of the invention and the conventional method. In the same manner as that of the conventional example, an example of forming a conductor pattern 20 will be explained here, in which an electrolytic copper plated layer 16 is formed on an electroless copper plated layer 12 on an insulating layer 10 of a wiring board.

Figure 1:
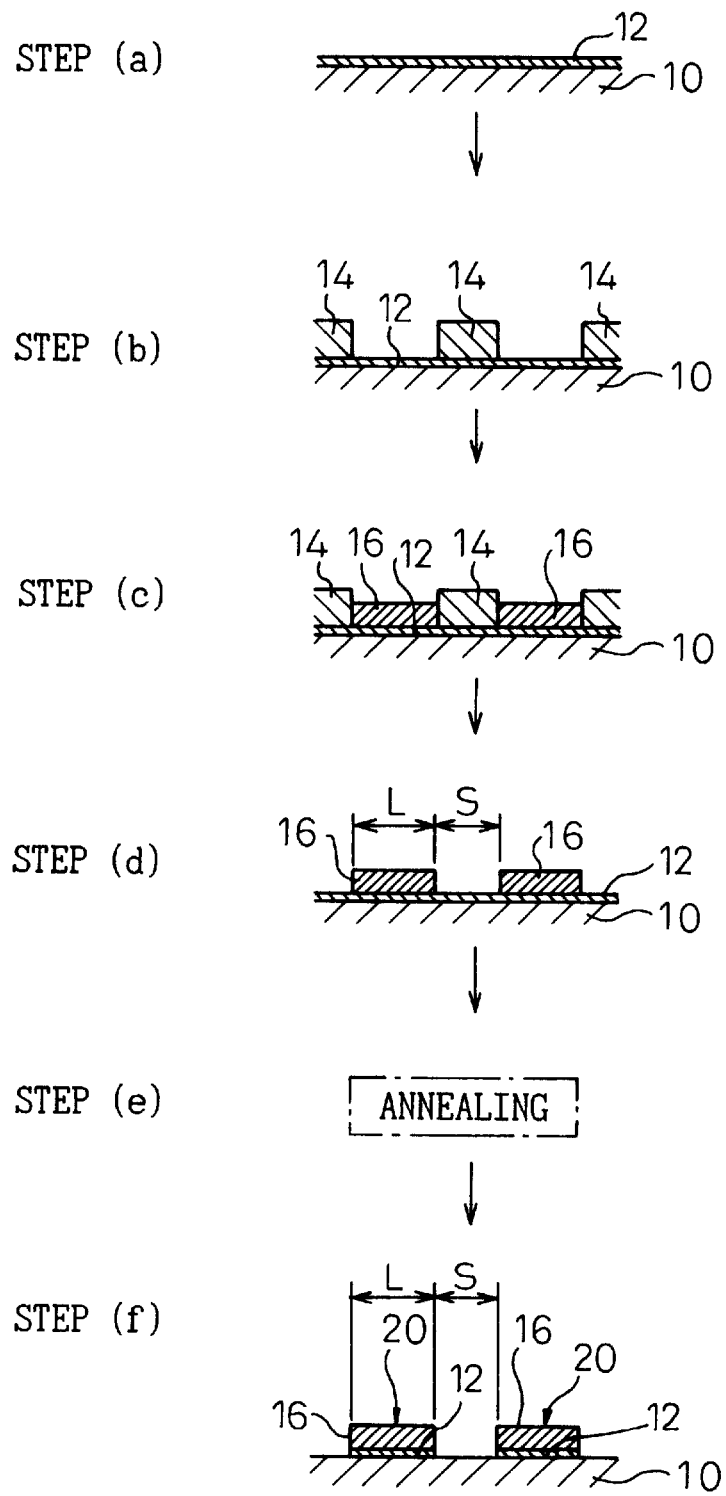
FIG. 1 is a process drawing showing a method of forming a conductor pattern on a wiring board according to the present invention.

First, the electroless copper plated layer 12 is formed on the insulating layer 10 of the wiring board as shown in Step (a) of FIG. 1.

Next, a layer of resist 14 is patterned on a surface of the electroless copper plated layer 12 as shown in Step (b) of FIG. 1.

Next, an electrolytic copper plated layer 16 is formed on a surface of the electroless copper plated layer 12 which is exposed from the plated resist 14 as shown in Step (c) of FIG. 1.

The above processes are the same as those of the conventional method of forming a conductor pattern on a wiring board.

In the conventional example, as shown in Step (d) of FIG. 6, a layer of etching resist 18 is formed on a surface of the electrolytic copper plated layer 16, however, formation of this etching resist 18 is not conducted in this example, but the layer of plated resist 14 is removed in this example. Due to the foregoing, the electroless copper plated layer 12, except for portions in which the electrolytic copper plated layer 16 is formed, is exposed as shown in Step (d) of FIG. 1.

The annealing treatment shown in Step (e) of FIG. 1 will be explained later.

Finally, the exposed electroless copper plated layer 12 is removed by using an etching solution as shown in Step (f) of FIG. 1. It is preferable to use an etching solution composed of a mixed water solution containing sulfuric acid, hydrogen peroxide and Cu chelate agent. According to the above method, it is possible to selectively etch only the electroless copper plated layer 12 while the electrolytic copper plated layer 16 is seldom etched, because the etching rate of electroless copper plating is different from the etching rate of electrolytic copper plating due to a difference in the crystallizing condition between electroless copper plating and electrolytic copper plating in an etching solution composed as described above.

The reason why the etching rate of electroless copper plating and the etching rate of electrolytic copper plating are different from each other in the etching solution is described below. The first reason is as follows. When an inspection is conducted by means of X-ray diffraction on the coat formed by each plating method, on the coat formed by electrolytic copper plating, there exists a peak on the surface of (111) which shows a state in which Cu atoms are most densely arranged. However, on the coat formed by electroless copper plating, there exists no peak. The reason is considered to be that the crystallizing property of the coat of electrolytic copper plating is higher than that of the coat of electroless copper plating. When a heat treatment is conducted on the coat of electrolytic copper plating, the peak existing on the coat of electrolytic copper plating becomes more remarkable.

The second reason is described as follows. On the coat of electroless copper plating, dots of copper are crystallized on a surface of the object to be plated, and when these dots of copper are connected with each other, a coat of plating is formed. On the other hand, on the coat of electrolytic copper plating, surfaces of copper are crystallized on a surface of the object to be plated. Due to the above difference in crystallization, the surface of electroless copper plated coat tends to be rough compared with the surface of electrolytic copper plated coat. As a result, the surface of electroless copper plated coat is susceptible to the attack of the etching solution.

Due to the foregoing, the thickness and width of the electrolytic copper plated layer 16 are not reduced. Accordingly, it is possible to set the thickness and width of the electrolytic copper plated layer 16 to the thickness and width of the target conductor pattern 20 even at the beginning of setting. Therefore, it is possible to form a conductor pattern 20, the interval of which is reduced to the limit of the resolution of the plated resist 14, that is, it is possible to form a fine conductor pattern.

Further, different from the conventional method of forming a conductor pattern, according to the method of this embodiment, it is unnecessary to provide a layer of etching resist for protecting the electrolytic copper plated layer 16 from the etching solution. Therefore, it is possible to omit the processes of forming and removing the layer of etching resist. Accordingly, the entire process of forming the conductor pattern can be simplified, and time can be saved.

As shown in Step (e) of FIG. 1, when an annealing process in which the electrolytic copper plated layer 16 is annealed is added between the process of forming the electrolytic copper plated layer shown in Step (c) of FIG. 1 and the process of removing the electroless copper plated layer 12 by using an etching solution, a difference in the crystallizing condition between the electroless copper plated layer and the electrolytic copper plated layer is further extended and a difference in the etching rate is extended. For the above reasons, it becomes possible to more selectively etch only the electroless copper plated layer 12. Due to the foregoing, a quantity of etching conducted on the electrolytic copper plated layer 16 can be further reduced. Accordingly, it is possible to form a finer conductor pattern. An example of the annealing condition is described as follows, The atmosphere is inert gas, the annealing temperature is 150° C., and the annealing time is 60 minutes.

Concerning the etching solution composed of a mixed aqueous solution containing sulfuric acid, hydrogen peroxide and Cu chelate agent, it is most preferable to use an etching solution in which a heterocyclic organic compound is used as Cu chelate agent.

FIG. 2 is a view showing a result of measurement of the thickness (film thickness) and width (pattern width) of the electrolytic copper plated layer 16 before and after etching is selectively conducted on the electroless copper plated layer 12 when annealing shown in Step (e) of FIG. 1 is conducted and the etching solution containing a heterocyclic organic compound is used. In this case, the thickness of the electroless copper plated layer 12 is 2 to 3 $\mu$m, and the annealing condition is that the temperature is 150° C. and the time is 60 minutes. Concerning the etching condition, the object is dipped in the etching solution at 25° C. for 3 minutes.

According to the result, the thickness of the electrolytic copper plated layer 16 after etching becomes smaller than the thickness of the electrolytic copper plated layer 16 before etching by about 1 $\mu$m, and the width of the electrolytic copper plated layer 16 after etching becomes smaller than the width of the electrolytic copper plated layer 16 before etching by about 1 $\mu$m. In other words, the thickness and width are hardly changed. Concerning the fraction L/S, L represents a width of the conductor pattern, and S represents a gap formed between the conductor patterns.

The reason why the electrolytic copper plated layer 16 is annealed after the layer of plated resist 14 has been removed is that removing the layer of plated resist 14 commonly becomes difficult after it has been annealed. As long as the layer of plated resist 14 can be removed even after it has been annealed, the electrolytic copper plated layer 16 may be annealed under the condition that the layer of plated resist is not removed.

Conditions of Example 1 are shown here in the order of processes.

EXAMPLE 1

(1) Formation of Insulating Layer
PVI-500B (Manufactured by Taiya Ink MFG. Co., LTD)
  Coating→Prebaking→Exposure→Development→Postbaking
(2) Making Surface of Insulating Layer Rough
Desmear treatment (Manufactured by SHIPLEY FAR EAST LTD.)
Swelling→Making surface rough→Neutralization
(3) Electroless Plating
(Manufactured by Uemura Kogyo K. K.)
(4) D/F Patterning
NIT-225 (Manufactured by Nichigo-Morton CO.,LTD.)
Laminate→Exposure→Development
(5) Pattern Plating (Electrolytic Copper Plating) Manufactured by Atotech Japan K. K.) 1 ASD, 60 minutes (Plated film thickness 15 $\mu$m)
(6) D/F Removing
(7) Base Etching
  Neo Brown (Manufactured by Ebara Densen LTD.) Dipped for 3 minutes at 25° C.→Dipped in $H_2SO_4$ (5 to 15%) for 1 minute→Washing
(8) Annealing
  Annealed at 150° C. for 60 minutes
(9) Formation of S/R
PSR-4000 (Manufactured by MFG. CO., LTD.)
  Coating→Prebaking→Exposure→Development→Postbaking
Composition of Neo Brown in the above Example is described as follows.
$H_2SO_4$: 4 to 6%
$H_2O_2$: 5 to 10%
$CuSO_4 \cdot 5H_2O$: Not more than 1%
Organic Sulfonate: Not more than 1%
Heterocyclic Organic Compound: Trace
Conditions of base etching conducted in item (7) in the above example are described as follows.
Conditions of Base Etching
Solution of base etching: Neo Brown (manufactured by Ebara Densan LTD.) Concentration of hydrogen peroxide is 7%.
(a) Dipping:
  Temperature of solution 25° C., dipping time 3 to 3.5 minutes
  Temperature of solution 30° C., dipping time 2 to 2.5 minutes
(b) Spray:
  Length of chamber 1 m,
  Spray pressure 0.5 to 0.7 kgf/cm$^2$
  Temperature of solution 30° C.,
  Spray time 60 seconds (1 m/min)
  Temperature of solution 35° C.,
  Spray time 45 seconds (1.2 to 1.4 m/min)
In both conditions of (a) and (b), the above result was obtained.

On the other hands, as a comparative example, the condition of base etching described in item (7) was determined as follows.
(c) Base etching NPE-300 (sodium peroxodisulfate manufactured by Mitsubishi Gas Chemical Company, Inc. 25° C., aqueous solution of 20%, dipped for 2 to 3 minutes
(d) Base etching Etching solution of cupric chloride 30 to 45° C., spraying time 5 to 10 seconds In both comparative examples of (c) and (d), the width of wiring and the thickness of a plated layer are remarkably reduced.

Figure 3:
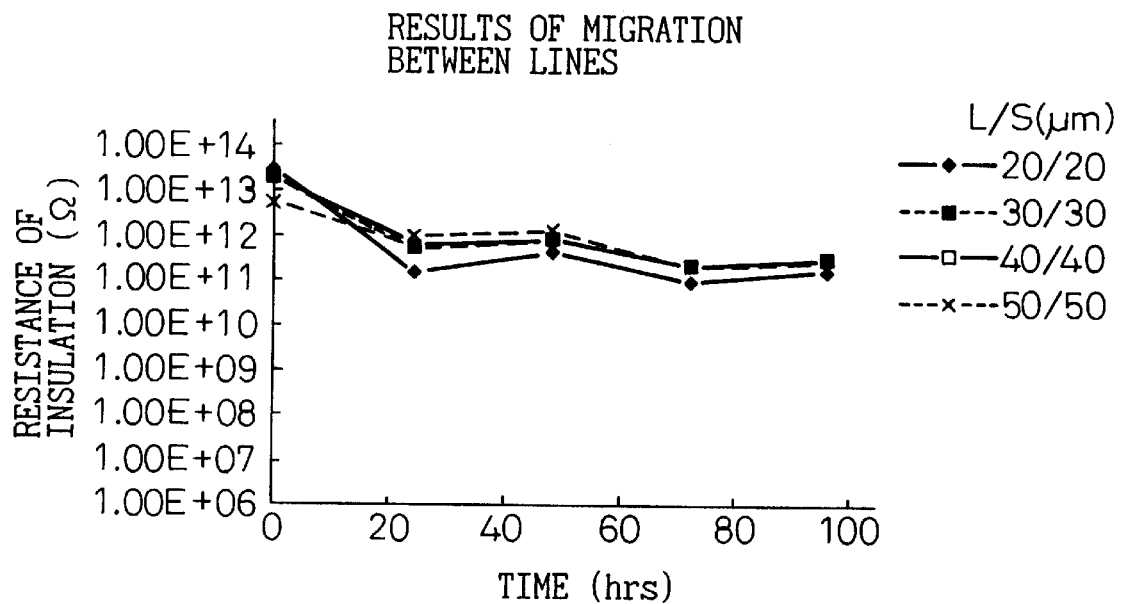
FIG. 3 is a graph showing a result of evaluation conducted on the migration between lines in an example of the present invention.

FIG. 3 is a diagram showing a result of evaluation of the migration between lines when etching was conducted and a pattern was formed by the method of Example 1 described above. In either case of L/S=20/20, 30/30, 40/40 or 50/50 ($\mu$m/$\mu$m), such circumstances were not recognized that the insulating resistance was remarkably deteriorated in accordance with a lapse of time.

Figure 4:
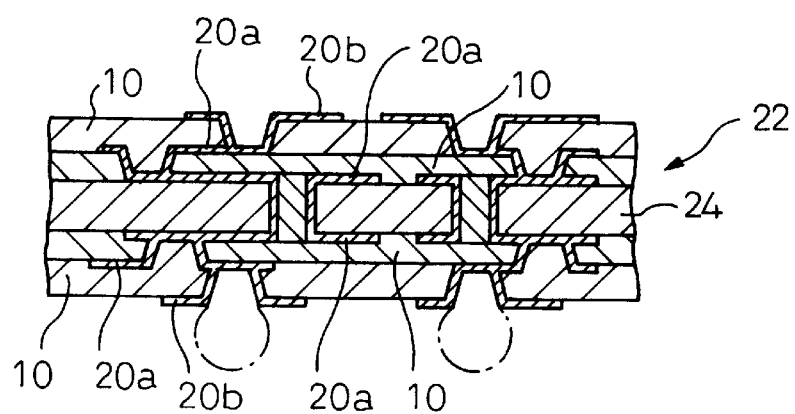
FIG. 4 is a cross-sectional view of a multiple wiring board.

The above method of forming a conductor pattern on a wiring board can be applied to not only the formation of a conductor pattern on a one-sided and on a two-sided wiring board but also the formation of a conductor pattern 20a on an inner layer of the multiple layer wiring board 22 shown in FIG. 4 and also the formation of a conductor pattern 20b on an outer surface.

Figure 5A:
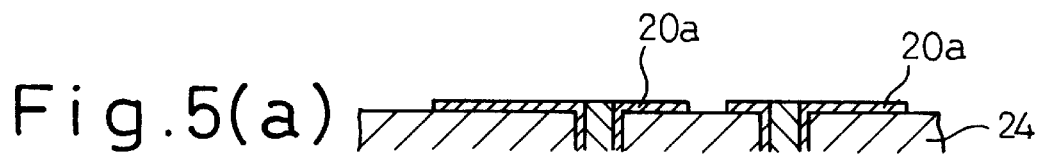
FIGS. 5(a) to 5(e) are process drawings showing a process of forming a multiple wiring board shown in FIG. 4 by the buildup method.
Figure 5B:
Figure 5C:
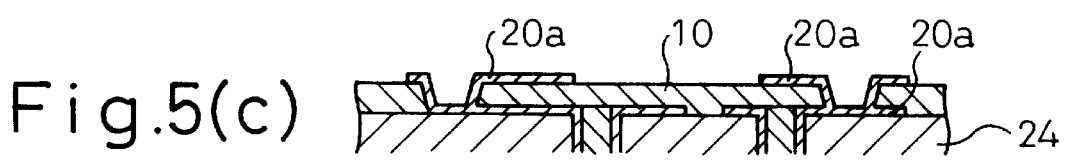

Specifically, the multiple layer wiring board 22 is formed by the process shown in FIGS. 5(a) to 5(e), which is referred to as a "buildup method". However, even when the conductor pattern 20a is formed on a surface of the base material 24 of the multiple layer wiring board 22 as shown in FIG. 5(a), the above method of forming a conductor pattern on a wiring board can be applied. Further, even when the insulating layer 10 is further formed on the conductor pattern 20a of the wiring board, as shown in FIG. 5(b), in such a manner that a part of the conductor pattern 20a is exposed by a recess 26 for forming a via and also a further conductor pattern 26a is formed, as shown in FIG. 5(c), on the insulating layer 10, the above method of forming a conductor pattern on a wiring board can be applied.

Figure 5D:
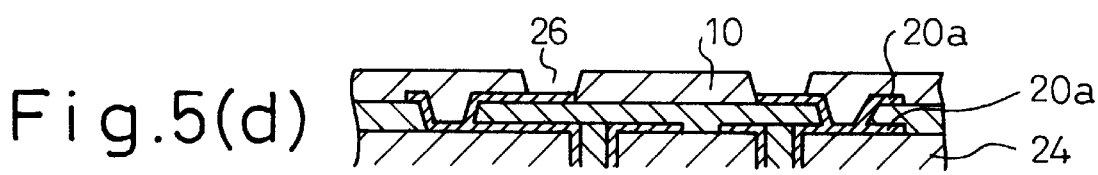
Figure 5E:
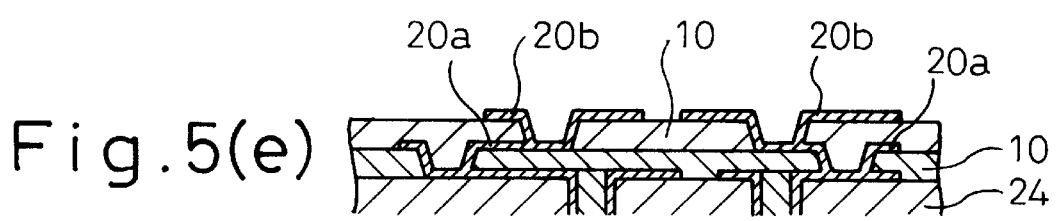

Further, when the same processes as those shown in FIGS. 5(b) and 5(c) are repeated, it is possible to form the conductor pattern 20b on the outermost layer via the insulating layer 10 as shown in FIGS. 5(d) and 5(e).

According to the present invention, the following effects can be provided. When an etching solution composed of a mixed aqueous solution containing sulfuric acid, hydrogen peroxide and Cu chelate agent is used, the etching rate of electroless copper plating is greatly different from the etching rate of electrolytic copper plating due to a difference in the crystallizing condition between electroless copper plating and electrolytic copper plating. Therefore, it is possible to selectively conduct etching on the electroless copper plated layer. Accordingly, it is unnecessary to provide a layer of etching resist used for protecting the electrolytic copper plated layer from the etching solution. Since the processes of forming and removing the layer of etching resist can be omitted, the entire process of forming the conductor pattern can be simplified. Since the thickness and width of the electrolytic copper plated layer are not reduced, the thickness and width of the electrolytic copper plated layer can be set to the values of the target conductor at the beginning of formation. Accordingly, it is possible to form a conductor pattern, the gap of which is decreased to a limit of resolution of resist.

When the electrolytic copper plated layer is heat-treated after the formation of the electrolytic copper plated layer before removing the electroless copper plated layer by using an etching solution, a difference in the crystallizing condition between electroless copper plating and electrolytic copper plating is further extended, and a difference in the etching rate is further extended. Accordingly, it is possible to conduct etching of the electroless copper plated layer more selectively. Due to the foregoing, the amount of etching conducted on the electrolytic copper plated layer is reduced. Therefore, it is possible to form a finer conductor pattern.

What is claimed is:

1. A method of forming a conductor pattern of a wiring board, said method comprising the steps of:
   electrolessly forming an electroless copper plated layer on a surface of an insulating layer for forming the wiring board;
   forming and patterning a layer of resist on the electroless copper plated layer;
   electrolytically forming an electrolytic copper plated layer on the electroless copper plated layer exposed from the layer of resist;
   removing the layer of resist for exposing the electroless copper plated layer except for portion in which the electrolytic copper plated layer is formed;
   removing the exposed electroless copper plated layer by using an etching solution composed of a mixed aqueous solution containing sulfuric acid, hydrogen peroxide and Cu chelate agent; and
   conducting an annealing heat treatment on the electrolytic copper plated layer.

2. The method according to claim 1, wherein the annealing heat treatment is conducted on the electrolytic copper plated layer before the layer of plated resist is removed.

3. The method according to claim 1, wherein the annealing heat treatment is conducted on the electrolytic copper plated layer after the layer of plated resist is removed.

4. The method of claim 1 wherein the annealing heat treatment is conducted on the electrolytic copper plated layer before the electroless copper plated layer is removed.

5. The method of claim 1 wherein the annealing heat treatment is conducted on the electrolytic copper plated layer after the electroless copper plated layer is removed.

6. A method of forming a conductor pattern of a wiring board, said method consisting essentially of the steps of:
   electrolessly forming an electroless copper plated layer on a surface of an insulating layer for forming the wiring board;
   forming and patterning a layer of resist on the electroless copper plated layer;
   electrolytically forming an electrolytic copper plated layer on the electroless copper plated layer exposed from the layer of resist;
   removing the layer of resist for exposing the electroless copper plated layer except for portion in which the electrolytic copper plated layer is formed;
   removing the exposed electroless copper plated layer by using an etching solution composed of a mixed aqueous solution containing sulfuric acid, hydrogen peroxide and Cu chelate agent; and
   conducting an annealing heat treatment on the electrolytic copper plated layer.

7. The method according to claim 6, wherein the annealing heat treatment is conducted on the electrolytic copper plated layer before the layer of plated resist is removed.

8. The method according to claim 6, wherein the annealing heat treatment is conducted on the electrolytic copper plated layer after the layer of plated resist is removed.

9. The method of claim 6 wherein the annealing heat treatment is conducted on the electrolytic copper plated layer before the electroless copper plated layer is removed.

10. The method of claim 6 wherein the annealing heat treatment is conducted on the electrolytic copper plated layer after the electroless copper plated layer is removed.

* * * * *